United States Patent [19]

Brennan

[11] Patent Number: 4,727,320

[45] Date of Patent: Feb. 23, 1988

[54] METHOD AND APPARATUS FOR MOTOR SIZE DETERMINATION

[75] Inventor: Michael A. Brennan, Louisville, Ky.

[73] Assignee: General Electric Company, Louisville, Ky.

[21] Appl. No.: 934,425

[22] Filed: Nov. 24, 1986

[51] Int. Cl.[4] ............................................. G01R 31/34
[52] U.S. Cl. ........................... 324/158 MG; 324/545
[58] Field of Search .............. 324/158 MG, 525, 545, 324/64; 318/490; 364/482

[56] References Cited

U.S. PATENT DOCUMENTS

| | | | |
|---|---|---|---|
| 3,307,102 | 2/1967 | Norkaitis | 324/51 |
| 3,947,764 | 3/1976 | Abbott et al. | 324/158 MG |
| 4,053,830 | 10/1977 | Porter | 324/51 |
| 4,187,525 | 2/1980 | Nagura et al. | 361/42 |
| 4,196,475 | 4/1980 | Hall | 364/482 |
| 4,204,425 | 5/1980 | Mallick, Jr. | 73/116 |
| 4,408,157 | 10/1983 | Beaubien | 324/62 |

Primary Examiner—Gerard R. Strecker
Assistant Examiner—Stephen M. Baker
Attorney, Agent, or Firm—H. Neil Houser; Radford M. Reams

[57] ABSTRACT

A method for testing motors having separate run and start windings to verify correct motor size and to detect miswiring of the motor windings comprises the steps of measuring the start winding resistance, measuring the run winding resistance, calculating a ratio of the start winding and run winding resistances and comparing the calculated ratio to a predetermined range representative of the desired motor size when correctly wired and rejecting the motor if the calculated ratio does not come within this predetermined range, and apparatus for same.

11 Claims, 5 Drawing Figures

METHOD AND APPARATUS FOR MOTOR SIZE DETERMINATION

BACKGROUND OF THE INVENTION

The present invention relates generally to methods and apparatus for testing of electric motors and more specifically to methods and apparatus for verifying motor size and detecting miswiring of motor windings.

Manufacturers of induction motors and also manufacturers of products incorporating induction motors generally make or use motors of various sizes. For example, a manufacturer of refrigerator compressors typically produces several compressor models each having a different capacity and incorporating a different size motor. Similarly the manufacturer of refrigerators typically produces several different models incorporating different size compressors. Obviously, it is essential to proper performance of the final product that the motor be the correct size. This is of concern with respect to refrigerator compressors because the external housing of the compressor may be the same for compressors of different capacity, equipped with motors of different horse power ratings. Thus, a visual inspection of the assembled compressor is unreliable. Also, in a highly automated manufacturing environment visual inspection may not be practical. Furthermore, such inspection would not detect miswiring of the motor which may erroneously occur in manufacture.

Over the years many different methods have been used by compressor manufacturers as well as manufacturers of other products incorporating induction motors to identify a motor by making electrical measurements of its start and run windings. In accordance with one conventional approach to making resistance measurements of the motor windings, the resistance of each winding is individually measured and compared to an upper and lower reject limit. This technique has been found to be not totally satisfactory in practice because the absolute value of the winding resistance may vary widely from one production lot of motors of the same size to another. Also the absolute resistance values for windings may vary widely with temperature.

An alternative approach to motor identification testing has been to make power measurements. However, it is desirable to determine motor size when the motor has little or no loading. Power measurements present a problem because under no load conditions different size motors may consume similar amounts of power.

Thus, there is a need for a method of testing motors to verify correct motor size and to detect miswiring defects which is more reliable than previously known methods and which readily lends itself to use in a highly automated production environment.

It is, therefore, a primary object of the present invention to provide a method and apparatus for reliably verifying motor size and detecting miswiring defects which is highly compatible with automated assembly of the finished product incorporating the motor.

SUMMARY OF THE INVENTION

In accordance with the present invention a method for testing motors having separate run and start windings to verify correct motor size and to detect miswiring of the motor windings comprises the steps of measuring the start winding resistance, measuring the run winding resistance, calculating a ratio of the start winding and run winding resistances and comparing the calculated ratio to a predetermined range representative of the desired motor size when correctly wired and rejecting the motor if the calculated ratio does not come within this predetermined range.

In a preferred form of the invention the resistance values are measured by applying a constant current of known magnitude to the start winding and measuring the resulting voltage across the start winding and repeating the step with respect to the run winding. In accordance with one form of the invention the resistance ratio is computed by dividing the measured start winding voltage by the measured run winding voltage. In accordance with another form of the invention the start winding voltage is divided by the constant current level to determine the absolute resistance of the start winding. The absolute resistance value for the run winding is similarly calculated. The ratio is then computed using these resistance values directly. The latter form is employed where it is desirable to obtain a statistical record of the absolute resistance values as an adjunct to testing for proper motor size.

A preferred form of testng apparatus in accordance with the present invention comprises a constant current source, switch means for separately connecting the current source to the run winding and start winding and a controller operative to selectively switch the first and second switch means into conduction. The controller further comprises means for measuring the voltage across the start winding and run windings respectively when energized, means for calculating the ratio of the start winding resistance to the run winding resistance and comparing this ratio to a range of acceptable ratio values for the desired motor size when properly wired, and means for generating a reject signal in the event the calculated ratio is not within the desired range.

BRIEF DESCRIPTION OF THE DRAWINGS

While the novel features of the invention are pointed out with particularity in the appended claims, the invention both as to organization and content will be more completely understood and appreciated from the following detailed description with reference to the drawings in which:

DETAILED DESCRIPTION

Figure 1:
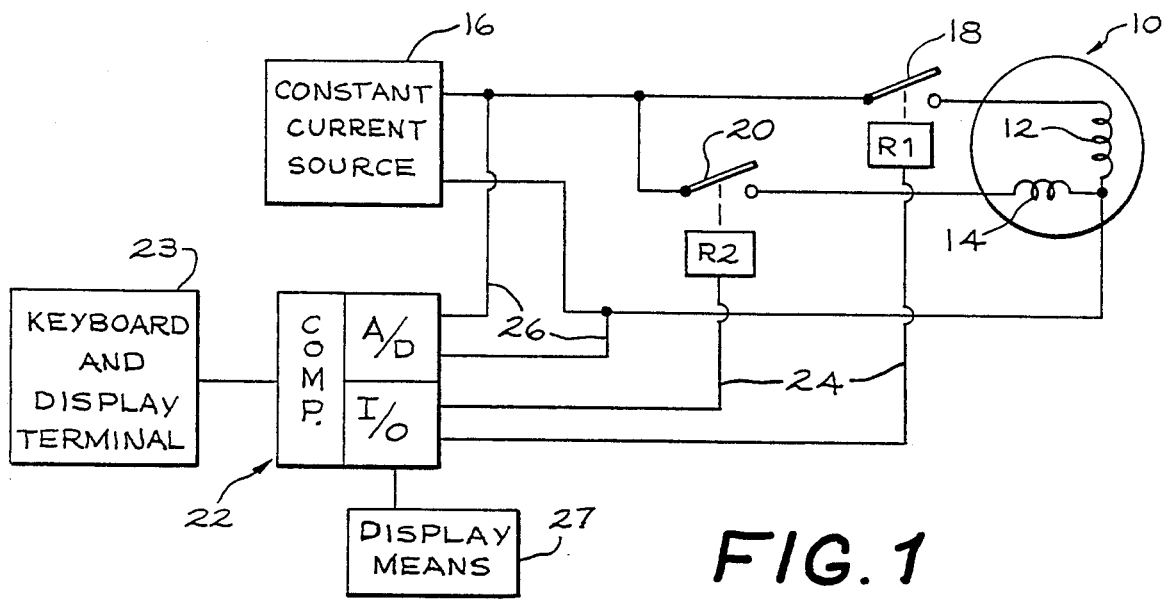
FIG. 1 is a simplified highly schematic functional block diagram of test apparatus for implementing the testing method of the present invention.

Apparatus for verifying motor size and detecting miswiring defects in accordance with the present invention is illustrated in FIG. 1 in generalized block diagram form. Motor 10 is to be tested for proper size. Motor 10 is an induction motor having a start winding 12 and a run winding 14. The test circuit which is connected to motor 10 for test comprises a constant current supply 16 which is coupled to start winding 12 via contacts 18 of relay R1, and to run winding 14 via contacts 20 of relay R2. Controller 22, comprising an input/output section (I/O), an analog to digital converter section (A/D) and a computation and memory storage section (COMP), controls performance of the test circuit. Keyboard and display terminal 23 facilitates user interaction with controller 22.

Controller 22 controls the states of relays R1 and R2 by Signals generated from the I/O section of controller 22 and coupled to R1 and R2 via lines 24. The motor parameters under test are measured by sensing the voltage across the load coupled to the constant current supply. This voltage is read into the A/D section of controller 22 via lines 26. Display means 25 responsive to controller 22 provides user discernible signals indicative of the test results.

Figure 2:
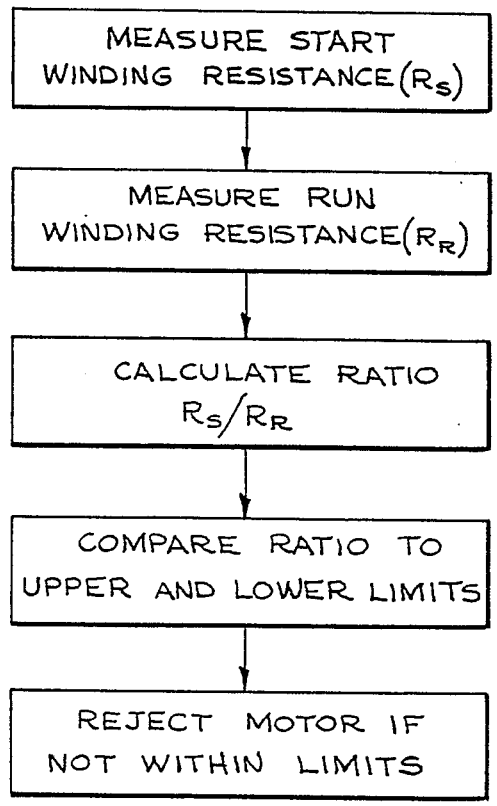
FIG. 2 depicts in block diagram form the steps for carrying out the testing method in accordance with the present invention.

The steps for the method carried out by the circuit FIG. 1 are shown in FIG. 2. The first two steps involve measuring the start winding resistance $R_S$ and the run winding resistance $R_R$ respectively. Next the ratio of start to run winding resistance is calculated. This ratio is then compared to a upper and lower limits defining an acceptable range of ratio values which have been empirically determined to be representative of the desired motor size. A ratio within the limits signifies that the motor is the proper size and properly wired. A ratio outside the upper and lower limits signifies that the motor is either of the wrong size or has been miswired and should be rejected.

Referring again to FIG. 1, prior to initiating the test the user enters the desired upper and lower ratio limits representative of the desired motor size via the keyboard and display terminal 23, thereby establishing the acceptable range. To measure start winding resistance, controller 22 generates appropriate signals on lines 24 to close R1 and open R2 thereby applying a constant current to start winding 12. The voltage across start winding 12 is read in via the A/D section of the controller 22 and stored. If desired, the absolute value of the start winding resistance can be computed within the controller by dividing the voltage measurement by the predetermined constant current value. This information can then be stored in the computer for statistical analysis purposes. Next controller 22 generates appropriate signals on lines 24 to open R1 and close R2 thereby applying a constant current to run winding 14. Voltage across run winding 14 is then entered into the computation and memory section of controller 22 via its A/D section. Again the actual run winding resistance may be computed by dividing this voltage by the constant current value and stored for statistical purposes. Next either the final resistance values or the start and run winding voltages may be used to calculate the ratio of start winding resistance to run winding resistance. This ratio is then compared to the predetermined upper and lower limits for acceptable ratios for the motor size under test and controller generates an accept signal or a reject signal to display means 27 to provide the appropriate display depending on whether the calculated ratio is within the limits or outside the limits respectively.

The method of the present invention has been found to be particularly advantageously employed in the production of refrigerator compressors for domestic refrigerators. For purposes of the illustrative embodiment the test circuit is to test motors for three different compressors rated at 800 BTU, 1000 BTU and 1200 BTU. The motors to be tested are rated at ⅛, ¼ and ⅓ horse power respectively.

The compressor housing dimensions are the same for all three compressors. Thus, on visual inspection all three compressors look the same. The compressor motor is assembled as part of the compressor assembly process in which the stator and rotor are inserted into the housing in separate steps. The dimensions of the stator and rotor for all three motors are such that the stator and rotor for the three different size motors are physically interchangeable in the compressor housing. Thus, it is desirable to test the fully assembled compressor to make sure the correct combination of stator and rotor has been properly assembled.

It has been empirically determined that for these motors there can be considerable variation in the absolute values of the start winding and run winding resistances from lot to lot within the same motor size. There also can be absolute resistance value variations due to variation in the temperature of the windings. These lot to lot and temperature variations render absolute resistance measurements unreliable indicators of motor size.

However, use of a ratio of the start winding and run winding values to determine motor size in accordance with the present invention substantially eliminates the adverse effects of these variations on motor size determination. This is believed due at least in part to the fact that such variations tend to track together for the start and run windings. Thus, in computing the ratio of winding resistances the effects of lot to lot and temperature variations tend to cancel to the extent that for a given motor size the resulting ratio consistently falls within a range sufficiently narrow to permit reliable motor size determination.

The ratio of start winding to run winding, being greater than one, is used for illustrative purposes as a matter of convenience. It will be appreciated, however, that the inverse ratio could be similarly employed within the scope of this invention. Table I lists nominal values for start winding resistance and run winding resistance, and the acceptable ranges of start winding to run winding resistance ratio for the three different compressors of interest along with the capacity of the compressor and the horsepower of the compressor motor.

TABLE I

| Compressor Capacity BTU | Motor Rated Horsepower | GE ID Number | Nominal Start Winding Resistance | Nominal Run Winding Resistance | Start to Run Ratio |
|---|---|---|---|---|---|
| 800 | ⅛ | C1125 | 26 | 6 | 4.0–4.8 |
| 1000 | ¼ | C1335 | 9 | 4.5 | 1.6–2.4 |
| 1200 | ⅓ | B1156 | 11 | 3 | 2.9–3.8 |

The acceptable ratio ranges listed in Table I have been empirically derived for the particular motors listed. Of course, the range values may be quite different for other motors Thus, it will be appreciated that appropriate ratio ranges should be empirically determined for the particular model and size motors to be tested.

An additional benefit of the test method of the present invention is that miswiring defects will also be detected, since the resistance ratios will fall outside the desired range if the motor windings are miswired.

Figure 3:
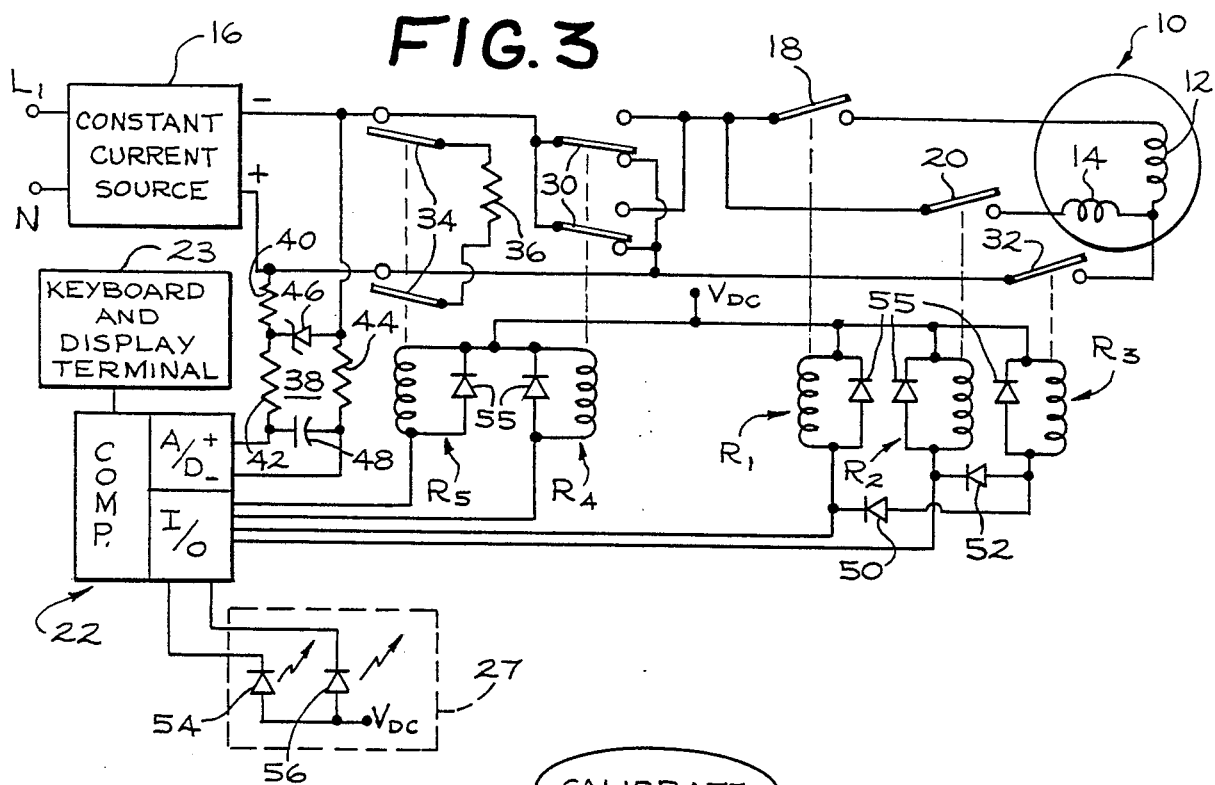
FIG. 3 is a schematic circuit diagram of an illustrative embodiment of the test apparatus of the present invention.

Referring now to FIG. 3, an illustrative embodiment of a test circuit for testing motors in accordance with the present invention is shown in greater detail. Constant current source 16 is connected across input power lines L1 and N of a standard 120 volt AC power supply. The negative output line from constant current source 16 is coupled to start winding 12 via short circuit relay contacts 30 and short winding relay contacts 18. Run winding 14 is to the negative output of constant current source 16 via run winding relay contacts 20. The positive output line from constant current source 16 is connected to the junction of start and run windings 12 and 14 respectively via common relay contacts 32. In order to protect constant current source 16 against the potentially damaging effects of extended periods of open circuit operation, short circuit contacts 30 are operative to short circuit the output of current source 16. Calibration relay contacts 34 are operative to couple calibration resistor 36 across the output of the current source to test the current source for proper operation.

The load voltage measured across the output of constant current source 16 is used for the various motor and calibration resistance measurements. This voltage is coupled to the A/D input of controller 22 via a network designated generally 38. Network 38 comprises resistors 40, 42 and 44, zener diode 46 and capacitor 48. Resistors 42 and 44 connecting the positive and negative current output lines to the positive and negative A/D inputs respectively, and capacitor 48 connected across the positive and negative A/D inputs, collectively act as a filter to smooth the signal applied to the A/D input. Zener diode 46 and resistor 40 protect the A/D input from voltage surges and the high open circuit output voltage of the current source, limiting the maximum voltage applied to the A/D input to 10 volts dc.

Relay coils R1, R2, and R3 control the relay contacts 18, 20, and 32 respectively. One side of each relay coil is connected to dc supply voltage, $V_{DC}$. The other sides of relay coils R1 and R2 are connected to associated output ports of the controller I/O section which are coupled to system ground via switches internal to controller 22. Relay coil R3 is connected in parallel with coils R1 and R2 via isolating diodes 50 and 52 respectively. By this arrangement relay coil R3 is energized whenever either coil R1 or coil R2 is energized in exclusive OR fashion. Relay coils R4 and R5, which control contacts 30 and 34 respectively, are similarly connected between supply voltage $V_{DC}$ and associated output ports of the I/O section of controller 22 and coupled to system ground via internal switches. A protective diode 56 is connected across each of relay coils R1-R5 to protect the I/O circuitry from transient voltage spikes when the relays are turned off.

Display means 27 comprises a pair of LEDs 54 and 56 connected between dc supply $V_{DC}$ and output ports of the I/O section of controller 22 and coupled to system ground via internal switches. LEDs 54 and 56 are selectively energized to signify motor acceptance and motor rejection respectively.

In operation the circuit is initially in the state shown in FIG. 3 with the shorting relays contacts in the shorting position and the motor winding contacts in the open position. To initiate a motor test, controller 22 de-energizes short circuit relay R4 to remove the short circuit load from the constant current source. Next controller 22 energizes start winding relay coil R1 to pull in the start winding contacts 18. After a delay to permit the contacts to settle, the voltage across the constant current source load is read in at the A/D input ports of the controller. Controller 22 then de-energizes start winding relay R1 to remove start winding 12 from the circuit and energizes run winding relay R2, to pull in run winding contacts 20. After a delay to permit the relay contacts to settle, the voltage across the constant current source load is again read into the A/D terminal of the controller and stored. Controller 22 then internally computes the resistance ratio and compares it to a predetermined range of acceptable values. If the ratio is within the acceptable range, LED 54 is energized signifying to the user that the motor has passed the ratio test. If the ratio is found to be outside the range, LED 56 is energized signifying to the user that the motor has failed the test.

Whenever a motor failure is detected, a calibration test is initiated to verify that the failure is in the motor and not the current source. Controller 22 initiates the calibration check on the circuit by de-energizing relay R4 and energizing calibration relay R5 to connect calibration resistor 36 across the constant current source. The voltage across the current source load is read into the A/D section of controller 22. If this voltage is not within the normal range indicating the circuit is operating properly a current source failure is signified by generation of an appropriate message at the keyboard and display terminal 23.

Controller 22 in the illustrative embodiment is a multi-bus computer system. The central processing unit (CPU) is an SBC 80/24 manufactured by Intel Corporation. The input/output board for this system is an SBC 108A also from Intel Corporation. The A/D converter portion of the system is a Datel ST711 A/D converter circuit. The keyboard and display terminal is a GE Operator Interface Terminal Model No. IC600KD5-10A, which is coupled to the CPU in conventional fashion.

The following component values are believed suitable for use in the circuit of FIG. 3. These values are exemplary only and are not intended to limit the scope of the claimed invention.

TABLE II

| Fixed Resistors (Ω) | Relays |
|---|---|
| 36 10 42,44 1K | R1, R2, R3 P&B AK4046 |
| 40 1K (25 watts) | R4, R5 P&B KH4599-1 |
| Diodes | Capacitor |
| 55 1N56 | 48 10 μf |
| LEDs | Zener |
| 54, 56 HLMP3200 | 46 10v (1 watt) |
| $V_{DC}$ | Output Current |
| 24 volts dc | 25 milliamps |

Figure 5:
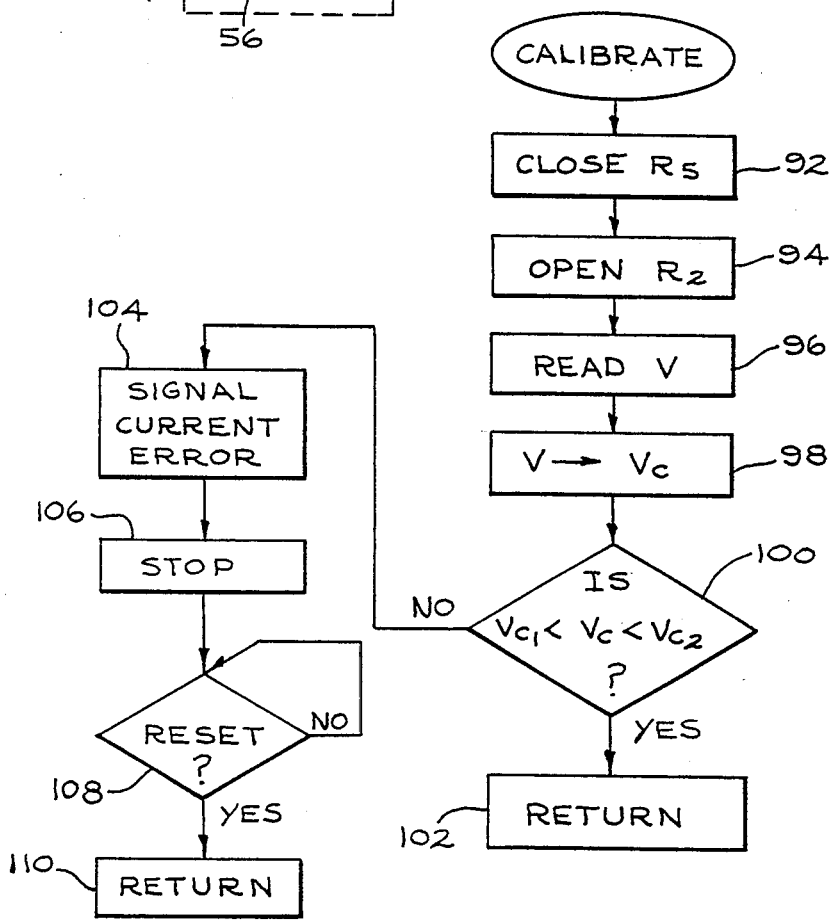
FIG. 5 is a flow diagram of the Calibration routine incorporated in the control program for the computer in the circuit of FIG. 3.
Figure 4:
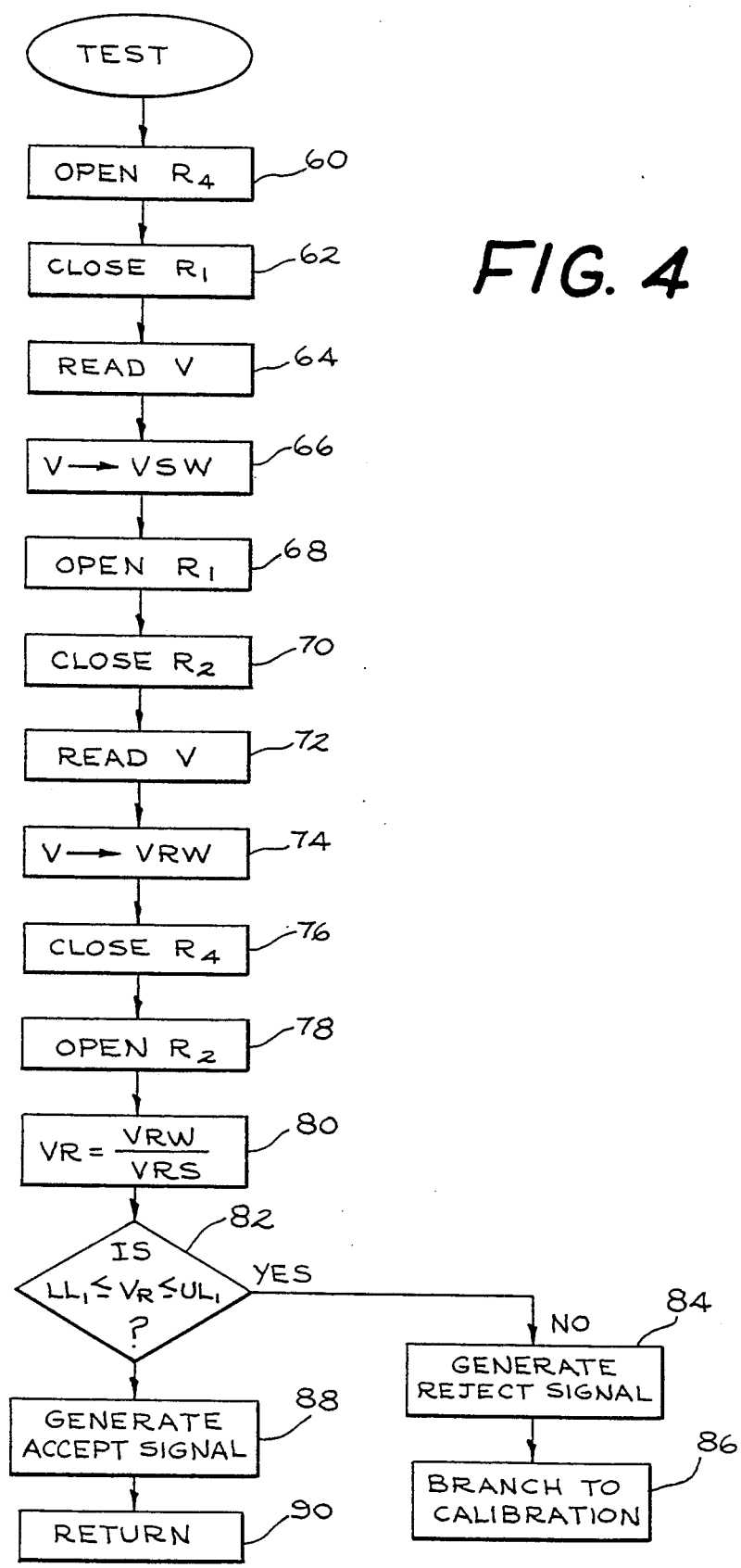
FIG. 4 is a flow diagram of the Test routine incorporated in the control program for the computer in the circuit of FIG. 3.

FIGS. 4 and 5 are flow diagrams which illustrate control routines incorporated in the control program of controller 22 to perform the control functions in accordance with the present invention. From these diagrams one of ordinary skill in the programming art can prepare a set of control instructions for storage in the memory of the controller. It will be appreciated that in addition to the control functions of the present test arrangement there may be other testing functions to be performed in conjunction with other characteristics of the motor. The test routine may be incorporated into a motor test program which controls performance of a variety of additional test functions which are not part of the present invention. Instructions for carrying out the routines described in the diagrams may be interleaved with instructions and routines for such other test functions. A description of each routine with reference to the flow diagrams follows.

It will be recalled that relay coils R1-R5 and LEDs 54 and 56 are coupled to ground via switches internal to controller 22. The relays are normally open relays. In the discussion to follow the reference made to energizing and de-energizing particular relays and LEDs shall be understood to mean closing and opening respectively the internal switches coupling the particular relays or LED to ground.

Referring now to FIG. 4, the test routine is entered to initiate the motor size test. First the short circuit relay R4 is de-energized to remove the short circuit across the current supply (Block 60). Next the start winding relay R1 is energized to pull in start relay contacts 18 (Block 62). After a delay on the order of 200 milliseconds to permit the relay contacts to settle, the voltage at the input to the A/D circuit is read in (Block 64) and stored as variable VSW (Block 66).

Having read in a voltage representative of the start winding resistance, relay R1 is de-energized to remove the start winding from the circuit (Block 68), and the internal switch coupling the run winding relay R2 to ground is closed thereby energizing R2 to pull in run winding contacts 20 (Block 70). After a delay on the order of 200 milliseconds to permit the contacts to settle, the voltage is read in to the A/D converter (Block 72) and stored as variable VRW (Block 74). Having completed the necessary voltage measurements, the short circuit relay R4 is energized (Block 76) to pull in shorting contacts 30 placing the short across the constant current supply and the run winding relay R2 is de-energized to open the motor circuit (Block 78). Next the ratio of run winding voltage to start winding voltage is calculated (Block 80) and compared (Inquiry 82) to the lower limit and upper limit the values LL and UL respectively. The particular values for LL and UL are selected by the user from the values of LL and UL listed in Table I for the motor size of interest and input via terminal 23. If the ratio is outside the selected range, a reject signal is generated (Block 84) energizing LED 56 and the program branches (Block 86) to the Calibration routine (FIG. 5). If the ratio is within the selected range, an accept signal is generated (Block 88) energizing LED 54 and the program returns (Block 90) to the master program.

Referring to FIG. 5, the Calibration routine is entered initially as part of power up for the system to insure that the constant current source powers up properly. Thereafter, the routine is entered whenever the test ratio calculated in the Test routine falls outside the acceptable range. The purpose of this routine is to verify that the constant current circuitry is operating properly. The test is initiated by energizing the calibration relay R5 (Block 92) and de-energizing the short circuit relay R4 (Block 94). After a delay of 200 milliseconds to permit the contacts to settle, the voltage at the A/D input is read in (Block 96) and stored (Block 98). This voltage is compared to the normal operating voltage range (Inquiry 100) defined as greater than VC1 and less than VC2. In the illustrative embodiment the values for VC1 and VC2 are 0.2 volts and 0.3 volts respectively. If the voltage $V_C$ is within the normal operating range defined by VC1 and VC2, the program returns to the main program (Block 102). If the voltage is outside this range, a test circuit error is signified (Block 104) via a display at terminal 23 and the program shuts down (Block 106) until manually reset (Inquiry 108) via the keyboard and display terminal 23, following which it returns to the main program (Block 110).

It will be apparent from the foregoing that the present invention provides a method and apparatus for the testing of motors for correct size and proper wiring which is more reliable than conventional methods; which is readily adaptable to a highly automated production environment; which can be used by the motor manufacturer near the end of the assembly process for qualify control; and which can also be used by a manufacturer of an end product incorporating a motor to test each motor for proper size prior to installation in the end product.

While in accordance with the Patent Statutes specific embodiments of the present invention have been illustrated and described herein, it is realized that numerous modifications and changes will occur to those skilled in the art. It is therefore to be understood that the appended claims are to cover all such modifications and changes as fall within the true spirit and scope of the invention.

What is claimed is:

1. A method of testing motors of the type having separate start and run windings to verify motor size and detect miswired motors comprising the steps of:
   (a) measuring the start winding resistance;
   (b) measuring the run winding resistance;
   (c) calculating a ratio of the start winding resistance and the run winding resistance;
   (d) comparing the calculated ratio to a predetermined ratio range representative of the desired motor size; and
   (e) rejecting the motor if the calculated ratio is outside this predetermined range.

2. The method of claim 1 wherein Step (c) comprises the step of calculating the ratio of start winding resistance to run winding resistance.

3. The method of claim 1 wherein Step (c) comprises the step of calculating the ratio of run winding resistance to start winding resistance.

4. The method of claim 2 wherein Step (a) comprises the steps of applying a predetermined current level from a constant current source to the start winding and measuring the voltage across the start winding; and wherein Step (b) comprises applying the predetermined current to the run winding and measuring the voltage across the run winding.

5. The method of claim 4 wherein Steps (a) and (b) respectively each comprise the additional step of determining the start and run winding resistances by calculating the ratio of start winding voltage and run winding voltage respectively to the predetermined current.

6. Apparatus for testing motors of the type having a separate start winding and run winding to verify motor size and detect miswiring of motor windings comprising:
   means for determining the resistance of the start and run windings;
   means for calculating a ratio of start winding resistance and run winding resistance;
   means for comparing said calculated ratio to a predetermined range of acceptable ratio values representative of the desired motor size when properly wired; and means responsive to said comparing means for generating a reject signal if said calculated ratio is outside said predetermined range of acceptable values.

7. The apparatus of claim 6 wherein said means for calculating is operative to calculate the ratio of start winding resistance to run winding resistance.

8. The apparatus of claim 6 wherein said means for calculating is operative to calculate the ratio of run winding resistance to start winding resistance.

9. The apparatus of claim 6 wherein said means for determining the resistance of the start and run windings comprises:

a constant current source;

means for applying current at a predetermined level from said current source to the start winding and run winding;

means for measuring the voltage across the start winding when said current is applied thereto and measuring the voltage across the run winding when said current is applied thereto, said voltages being proportional to the start winding and run winding resistances respectively.

10. The apparatus of claim 9 wherein said means for determining the start and run winding resistance further comprises means for respectively calculating the ratio of the start and run winding voltages to the predetermined current level.

11. Apparatus for automatically testing motors of the type having a separate start and run winding to verify motor size and detect miswiring of the motor windings comprising:

a constant current source;

first and second switch means for connecting the start and run windings respectively to said constant current source;

controller means operative to selectively switch said first and second switch means into conduction to separately energize the start and run windings;

said controller means including means for measuring the respective voltages across the start winding when energized and the run winding when energized; means for calculating the ratio of the start winding voltage to the run winding voltage corresponding to the ratio of run winding resistance to start winding resistance; means for comparing said calculated ratio to a predetermined range of acceptable ratio values representative of the desired motor size when properly wired; and means responsive to said comparing means for generating a reject signal if the calculated ratio is outside said predetermined range of acceptable values.

* * * * *